United States Patent [19]
Nagata

[11] Patent Number: 6,061,275
[45] Date of Patent: May 9, 2000

[54] SEMICONDUCTOR INTEGRATED CIRCUIT DEVICE HAVING CLAMP CIRCUIT FOR ACCELERATING DATA TRANSFER ON DATA BUS

[75] Inventor: Kyoichi Nagata, Tokyo, Japan

[73] Assignee: NEC Corporation, Tokyo, Japan

[21] Appl. No.: 09/267,229

[22] Filed: Mar. 12, 1999

[30] Foreign Application Priority Data

Mar. 13, 1998 [JP] Japan .................................. 10-062645

[51] Int. Cl.[7] .................................................. G11C 7/00
[52] U.S. Cl. ............................... 365/189.06; 365/189.11; 365/203
[58] Field of Search ......................... 365/189.06, 189.05, 365/203, 189.11

[56] References Cited

U.S. PATENT DOCUMENTS

| | | | |
|---|---|---|---|
| 5,058,067 | 10/1991 | Kertis | 365/189.06 |
| 5,307,307 | 4/1994 | Wada et al. | 365/189.06 |
| 5,638,328 | 6/1997 | Cho | 365/189.06 |
| 5,642,314 | 6/1997 | Yamaguchi | 365/189.06 |

FOREIGN PATENT DOCUMENTS

| | | |
|---|---|---|
| 1-192081 | 8/1989 | Japan . |
| 4-38697 | 2/1992 | Japan . |

*Primary Examiner*—Son T. Dinh
*Attorney, Agent, or Firm*—Hutchins, Wheeler & Dittmar

[57] ABSTRACT

A semiconductor memory device supplies data bits to a data bus at extremely short intervals, and a first clamp circuit, a second clamp circuit and a precharge circuit are connected between a constant voltage line at 1.0 volt and the data bus, between two power supply lines at 2.0 volts and the ground level and the data bus and between data lines of the data bus, wherein the precharge circuit balances the data lines around a clamp voltage at 1.2 volts between the data transfer for one data bit and the next data transfer for another data bit, and the second clamp circuit makes the amplitude on the data lines narrow so as to accelerate the successive data transfers.

26 Claims, 8 Drawing Sheets

SEMICONDUCTOR INTEGRATED CIRCUIT DEVICE HAVING CLAMP CIRCUIT FOR ACCELERATING DATA TRANSFER ON DATA BUS

FIELD OF THE INVENTION

This invention relates to a semiconductor integrated circuit device such as, for example, a semiconductor memory device and, more particularly, to a semiconductor integrated circuit device having a clamp circuit for accelerating a data transfer on a data bus.

DESCRIPTION OF THE RELATED ART

The memory cells of the semiconductor memory device have been increased through the scaling down, and, accordingly, the component field effect transistors of the memory cell are miniaturized. The miniature field effect transistor has a thin gate oxide, and the gate oxide layer is much liable to be damaged under the gate potential of the previous generation. For this reason, the power voltage is lowered.

FIG. 1 illustrates a prior art semiconductor memory device. The prior art semiconductor memory device comprises plural memory banks 1/2, a pair of data lines GIOT/GION shared between the plural data banks 1/2 and a data amplifier 3 connected to the data lines GIOT/GION. Though not shown in FIG. 1, plural memory cells are incorporated in the memory banks 1/2, and are selectively connected to digit line pairs LIOT/LION. The memory banks 1/2 further have transfer gates 1a/2a, and the digit lines LIOT/LION of each pair propagate a data signal and the complementary data signal between the transfer gate and a selected memory cell. The data signal and the complementary data signal represent a data bit, and the data bit is stored in one of the memory cells.

The prior art semiconductor memory device further comprises a precharge circuit 4 and a clamp circuit 5 both connected to the data lines GIOT/GION. The precharge circuit 4 is implemented by a p-channel enhancement type field effect transistor Qp1, and the p-channel enhancement type field effect transistor Qp1 is responsive to a control signal P10 for offering a conductive channel between the data lines GIOT and GION. The clamp circuit 5 has two n-channel enhancement type field effect transistors Qn1/Qn2 connected between a power supply line VCC and the data lines GIOT/GION. Control signals RASB and PEN are supplied to the gate electrodes of the n-channel enhancement type field effect transistors Qn1/Qn2, and the n-channel enhancement type field effect transistors Qn1/Qn2 are changed between on-state and off-state depending upon the voltage level of the control signals RASB/PEN. For this reason, the clamp circuit 5 pulls up the data lines GIOT/GION to a high level lower than the positive power voltage Vcc by the threshold Vt of the n-channel enhancement type field effect transistors Qn1/Qn2. In this instance, the positive power voltage Vcc is 2 volts, and the threshold Vt is 0.5 volt. The high level is 1.5 volts.

The prior art semiconductor memory device further comprises a read/write data bus RWBST/RWBSN, an input/output circuit 6 and a data pin 7. The read/write data bus RWBST/RWBSN is connected between the data amplifier 3 and the input/output circuit 6, and the data pin 7 is connected to the input/output circuit 6. The input/output circuit 6 produces an output data signal from the potential difference on the read/write data bus RWBST/RWBSN, and supplies the output data signal to the data pin 7. An input data signal is supplied to the data pin, and the input/output circuit 6 produces a potential difference on the read/write data bus RWBST/RWBSN from the input data signal.

In order to access a data bit, a memory cell is selected from the memory banks 1/2, and the data bit produces a potential difference between the digit lines LIOT and LION. The associated transfer gate 1a/2a turns on, and the digit lines LIOT/LION are connected through the transfer gate 1a/2a to the data lines GIOT/GION, respectively. Then, one of the data lines GIOT/GION is pulled down to a low level. In this instance, the low level is of the order of 0.8 volt. A potential difference is produced on the data lines GIOT and GION, and is propagated to the data amplifier 3. The data amplifier 3 is responsive to the potential difference on the data line pair GIOT/GION for generating a data signal on the read/write data bus RWBST/RWBSN.

A problem is encountered in the prior art semiconductor memory device in a long time period for generating the potential difference between the data lines GIOT and GION. Firstly, the clamp circuit 5 firstly maintains both data lines GIOT/GION at 1.5 volts, and one of the data lines GIOT/GION is pulled down to 0.8 volt. The potential decay is 0.7 volt, and the prior art semiconductor memory device requires 4 nanoseconds for the wide potential decay.

Other prior art semiconductor integrated circuit devices are proposed in Japanese Patent Publication of Unexamined Application Nos. 1-192081 and 4-38679. Japanese Patent Publication of Unexamined Application No. 1-192081 discloses a clamp circuit connected between data lines so as to limit a potential difference between the data lines within a predetermined value, and the data lines are forcibly clamped around a half of the power voltage Vcc. If the power voltage Vcc is 2.0 volts, the data lines are clamped at 1.0 volt. However, when the potential level on the data line is decayed under 1.1 volts, through-current flows in the data amplifier, and a large amount of current is consumed.

Japanese Patent Publication of Unexamined Application 4-38697 discloses a pull-up circuit for pulling up a data line pair, a clamp circuit for clamping the data lines at a predetermined potential level and a differential amplifier for reading out a data on the data line pair through the differential amplification. However, the Japanese Patent Publication is silent to a narrow amplitude. The data line pair is firstly regulated to a voltage level lower than the power voltage level Vcc by the threshold of the component field effect transistors.

Thus, the prior art semiconductor integrated circuit device disclosed in Japanese Patent Publication of Unexamined Application No. 1-192081 is not feasible in an ultra large scale integration, because the current consumption is too much. The prior art semiconductor integrated circuit device disclosed in the other Japanese Patent Publication of Unexamined Application can not accelerate the data transfer in a serial manner, because the data signal is expected to widely swing the data lines.

SUMMARY OF THE INVENTION

It is therefore an important object of the present invention to provide a semiconductor integrated circuit device, which transfers a data signal along a data but at high speed.

In accordance with one aspect of the present invention, there is provided a semiconductor integrated circuit device comprising a destination for receiving a data signal representative of data, a data source for producing the data, a data bus connected between the data source and the destination and including a first data line and a second data line paired with the first data line for propagating the data signal in the form of a potential difference from the data source to the destination, a first clamp circuit connected between a source of a first voltage and the first and second data lines, and a second clamp circuit connected between a source of a second voltage higher in potential level than the first voltage, the first and second data lines and a source of a third voltage lower in potential level than the first voltage and clamping one of the first and second data lines to a certain potential level between the first voltage and the second voltage for generating the data signal on the first and second data lines.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENT

Figure 1:
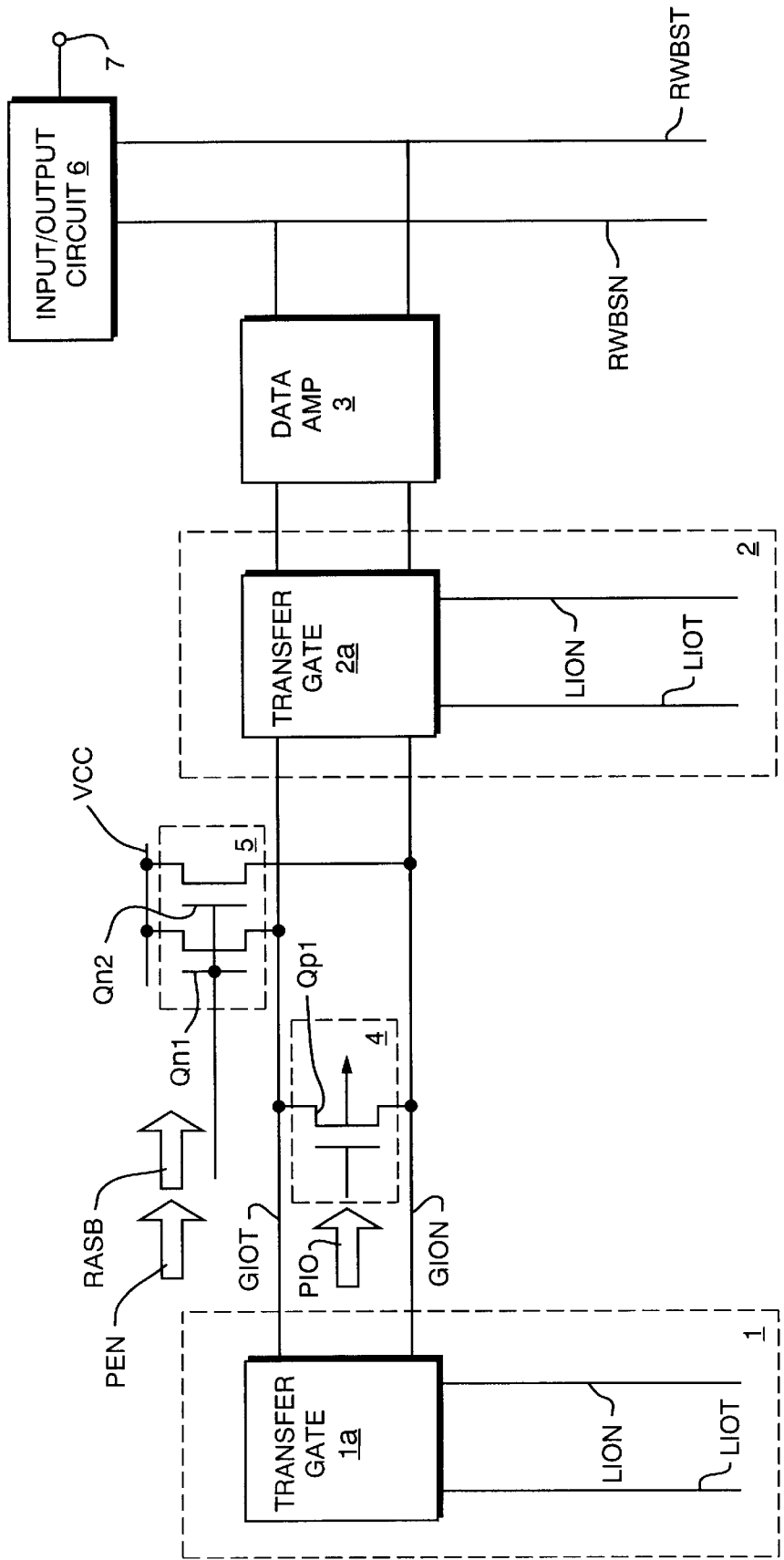
FIG. 1 is a circuit diagram showing the prior art semiconductor memory device.
Figure 2A:
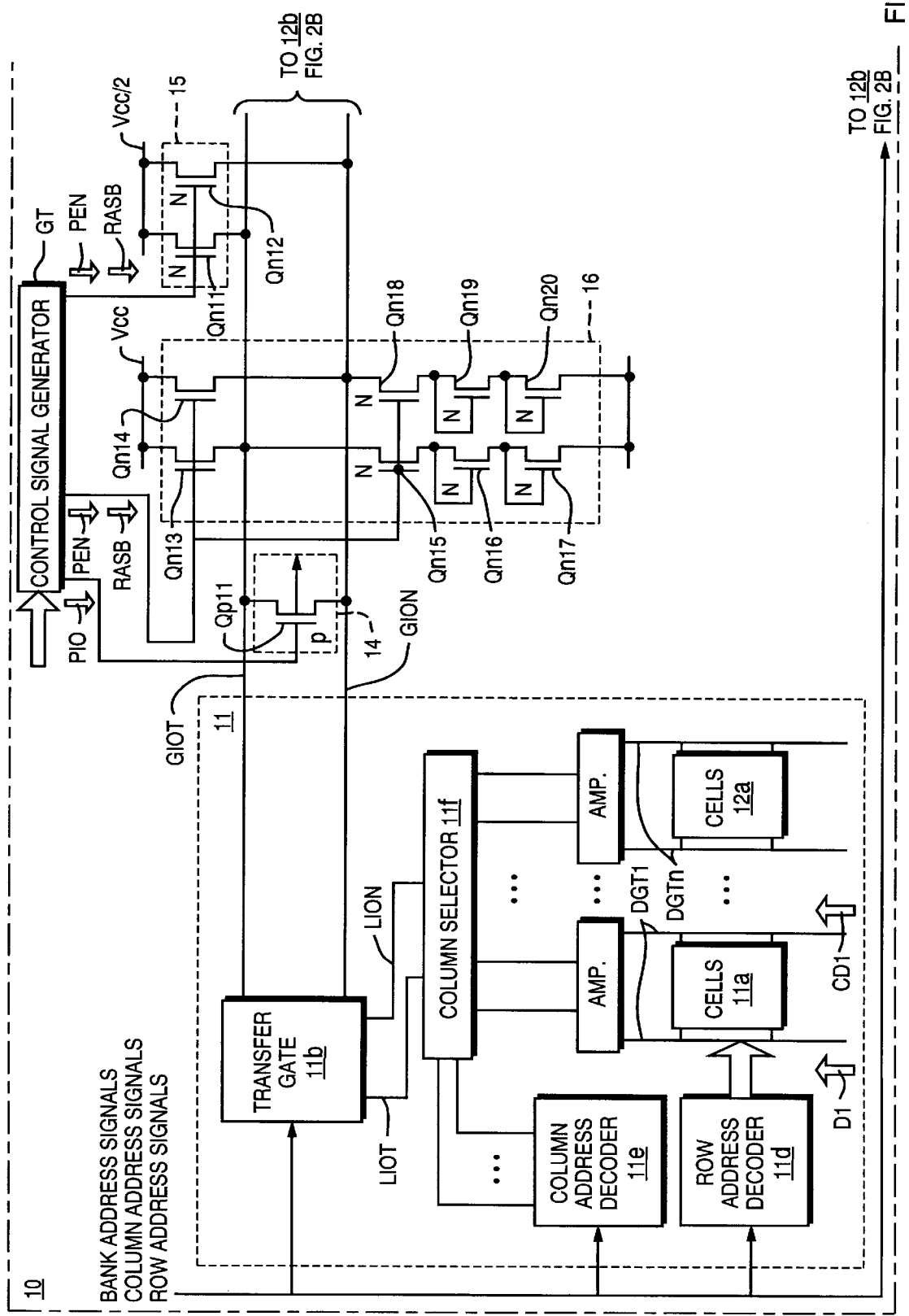
FIG. 2 is a circuit diagram showing a semiconductor memory device according to the present invention.
Figure 2B:
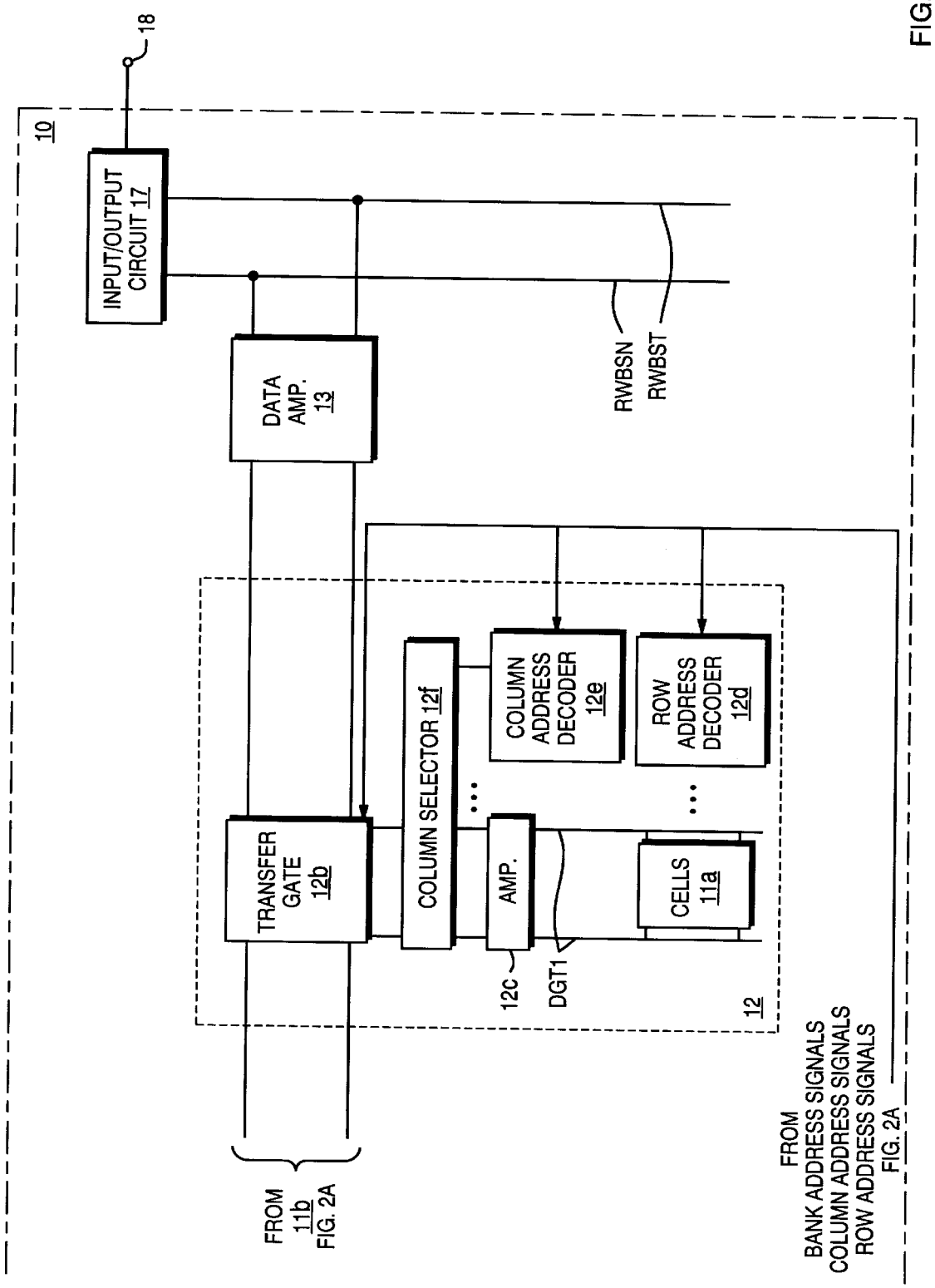

Referring to FIG. 2 of the drawings, a semiconductor memory device is fabricated on a semiconductor chip 10. The semiconductor memory device comprises plural memory banks 11/12, a pair of data lines GIOT/GION shared between the plural data banks 11/12 and a data amplifier 13 connected to the data lines GIOT/GION. The memory banks 11/12 are similar in arrangement to one another, and only the memory bank 11 is detailed. Plural memory cells 11a/12a are incorporated in each of the memory banks 11/12, and store data bits, respectively. The memory cells 11a/12a are selectively connected to digital line pairs DGT1 . . . and DGTn, and a data bit produces a potential difference on the associated digit line pair DGT1/DGTn.

The memory banks 11/12 further include transfer gates 11b/12b, sense amplifiers 11c/12c, row address decoders 11d/12d, column address decoders 11e/12e, column selectors 11f/12f and data line pairs LION/LIOT. Internal row address signals are supplied to the row address decoders 11d/12d, and the row address decoders 11d/12d selectively connect the memory cells 11a/12a to the digit line pairs DGT1–DGTn. Then, the data bits are transferred between the selected memory cells 11a/12a and the associated digit line pairs DGT1–DGTn. Each of the data bit is represented by a potential difference between a data signal D1 and a complementary data signal CD1. The digit line pairs DGT1–DGTn propagate the data signals D1 and the complementary data signals CD1 between the sense amplifiers 11c/12c and the selected memory cell 11a/12a, and the sense amplifiers 11c/12c increase the magnitude of the potential differences on the associated digit line pairs DGT1 to DGTn. The increased potential differences are supplied from the sense amplifiers 11c/12c to the column selectors 11f/12f. Internal column address signals are decoded by the column address decoder 11e/12e, and the column address decoder 11e/12e causes the column selector 11f/12f to transfer a data bit from a selected digit line pair DGT1/DGTn through the data line pairs LION/LIOT to the transfer gates 11b/12b. The transfer gates 11b/12b are responsive to internal bank address signals so as to connect a selected data line pair LION/LIOT to the pair of data line GION/GIOT.

The semiconductor memory device further comprises a precharge circuit 14 connected between the data lines GION and GIOT, a first clamp circuit 15 connected between a positive constant voltage line Vcc/2 and the data lines GION/GIOT, a second clamp circuit 16 connected not only between a positive power supply line Vcc and the data lines GION/GIOT but also between the data lines GION/GIOT and a ground line GND and a control signal generator GT for sequentially producing internal control signals. In this instance, the positive power supply line Vcc is regulated to 2.0 volts, and the positive constant voltage line Vcc/2 supplies a positive constant voltage equal to half of the positive power supply line Vcc to the first clamp circuit 15.

The precharge circuit 14 is implemented by a p-channel enhancement type field effect transistor Qp11, and the p-channel enhancement type field effect transistor Qp11 is responsive to a precharge control signal PIO so as to create a conductive channel between the data lines GIOT and GION. The p-channel enhancement type field effect transistor Qp11 balances the data lines GION and GIOT at a precharge level equal to the positive constant voltage level Vcc/2.

The clamp circuit 15 includes two n-channel enhancement type field effect transistors Qn11/Qn12. The n-channel enhancement type field effect transistors Qn11/Qn12 have respective drain nodes connected to the positive constant voltage line Vcc/2 and respective source nodes connected to the data lines GIOT/GION. A control signal RASB or PEN is selectively supplied to the gate electrodes of the n-channel enhancement type field effect transistors Qn11/Qn12. The manufacture designs the control signal generator GT to generate one of the control signals RASB and PEN depending upon user's request. The control signal RASB is one of the control signals in the row addressing system, and PEN is one of the control signals in the column addressing system called as "pipeline enable signal". The n-channel enhancement type field effect transistors Qn1/Qn2 are responsive to the control signal RASB/PEN so as to create conductive channels from the positive constant voltage line Vcc/2 to the data lines GIOT/GION. As a result, the first clamp circuit 15 clamps the data lines GIOT/GION at the positive constant voltage level Vcc/2, i.e., 1.0 volt.

The second clamp circuit 16 includes n-channel enhancement type field effect transistors Qn13/Qn14 connected between the positive power voltage line Vcc and the data lines GIOT/GION, a series combination of n-channel enhancement type field effect transistors Qn15/Qn16/Qn17 connected between the data line GIOT and the ground line GND and a series combination of n-channel enhancement type field effect transistors Qn18/Qn19/Qn20 connected between the other data line GION and the ground line GND. The selected control signal RASB or PEN is supplied to the gate electrodes of the n-channel enhancement type field effect transistors Qn13/Qn14 and the gate electrodes of the n-channel enhancement type field effect transistors Qn15/Qn18, and those n-channel enhancement type field effect transistors Qn13/Qn14/Qn15/Qn18 are changed between the on-state and the off-state depending upon the potential level of the control signal RASB/PEN. The n-channel enhancement type field effect transistors Qn16/Qn17/QN19/Qn20 have respective drain nodes connected to the gate electrodes thereof, and, accordingly, serve as diodes.

The first clamp circuit 15 clamps the data lines GIOT/GION at 1.0 volt in the initial stage of a data access. When the control signal RASB/PEN makes the second clamp circuit 16 active, the data lines GIOT/GION are clamped at 1.2 volts. The circuit behavior of those claim circuits 15/16 will be hereinlater described in detail.

The semiconductor memory device further comprises a read/write data bus RWBST/RWBSN, an input/output circuit 17 and a data pin 18. The read/write data bus RWBST/RWBSN is connected between the data amplifier 13 and the input/output circuit 17, and the data pin 18 is connected to the input/output circuit 17. The input/output circuit 17 produces an output data signal from the potential difference on the read/write data bus RWBST/RWBSN, and supplies the output data signal to the data pin 18. An input data signal is supplied to the data pin 18, and the input/output circuit 17 produces a potential difference on the read/write data bus RWBST/RWBSN from the input data signal.

Figure 3:
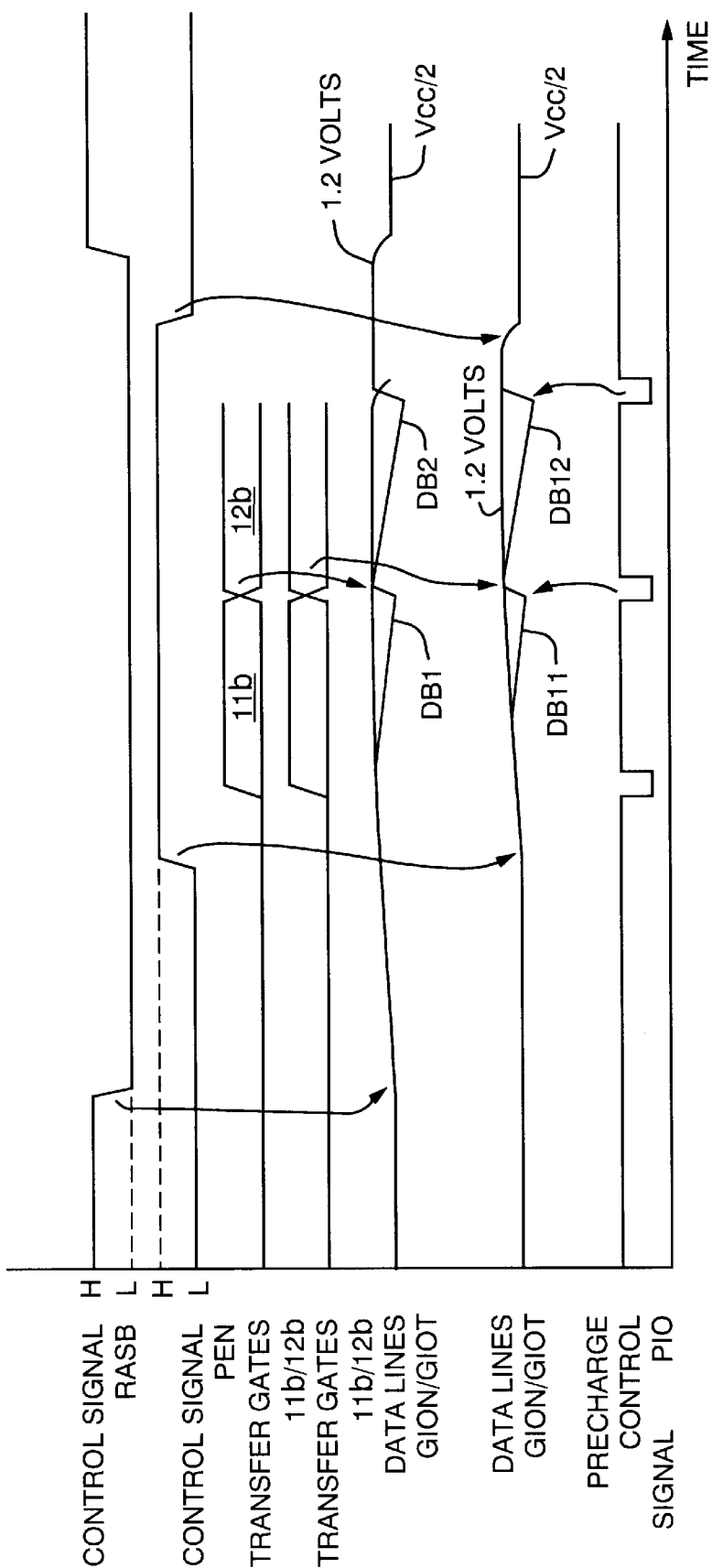
FIG. 3 is a timing chart showing a pipeline data access and a sequential column access in a composite manner.

Description is hereinbelow made on two kinds of read-out sequence with reference to FIG. 3. The control signal PEN is used in the first kind of read-out sequence, and the control signal RASB is used in the second kind of read-out sequence. The two kinds of read-out sequence are illustrated in FIG. 3 in a composite manner.

The data lines GIOT/GION have been already precharged at 1.0 volt. When the row address strobe signal RASB is changed from the high level to the low level, the n-channel enhancement type field effect transistors Qn11/Qn12 turn off, and the n-channel enhancement type field effect transistors Qn13/Qn14 and Qn15/Qn18 also turn off. As a result, the first clamp circuit 15 isolates the data line pair GION/GIOT from the positive constant voltage line Vcc/2, and the second clamp circuit 16 isolates the data line pair GION/GIOT from the positive power supply line Vcc.

The control signal RASB allows the row address decoders 11d/12d to decode the internal row address signals, and data bits are read out from selected memory cells 11a/12a to the associated digit line pairs DGT1–DGTn. The sense amplifiers 11c/12c increase the magnitude of the potential differences representative of the data bits. The column address decoders 11e/12e decode the internal column address signals so that the column selectors 11f/12f connect selected digit line pairs to the associated data line pairs LION/LIOT, respectively. The transfer gates 11b/12b selectively turn on so as to transfer the read-out data bits DB1/DB2 ... from the data line pairs LIOT/LION to the data line pair GIOT/GION, and the precharge control signal PIO is maintained at the inactive high level during the sequential column access. The transfer gate 11b transfers a read-out data bit DB1 from the associated data line pair LION/LIOT to the data line pair GION/GIOT, and the data amplifier 13 determines the logic level of the read-out data bit DB1. Then, another transfer gate 12b is changed to the on state so as to connect the associated data line pair LION/LIOT to the data line pair GION/GIOT. The potential difference on the digit line pair GION/GIOT is affected by the potential difference on the data line pair LION/LIOT representing the read-out data bit DB2, and the read-out data bit DB2 is transferred to the data line pair GION/GIOT. The data transfer from the data line pair LION/LIOT to the data line pair GION/GIOT consumes a relatively long time.

On the other hand, the precharge control signal PIO is periodically changed to the active low level between the data transfer in the other kind of read-out sequence. The internal control signal PEN allows the first clamp circuit 15 and the second clamp circuit 16 to connect the positive constant voltage line Vcc/2 and the positive power supply line Vcc to the data lines GION/GIOT. Data bits DB11/DB12 have reached the data line pairs LION as similar to the read-out sequence described hereinbefore.

The transfer gate 11b transfers the first read-out data bit DB11 from the data line pair LION/LIOT to the data line pair GION/GIOT, and the data bit DB11 generates a potential difference on the data line pair GION/GIOT. The data amplifier 13 determines the logic level of the rad-out data bit DB11. Then, the precharge control signal PIO is changed to the active low level, and the data lines GION/GIOT are balanced at the precharge level. The transfer gate 12b is changed to the on state, and the next data bit DB12 is transferred to the data line pair GION/GIOT. The data bit DB12 generates a potential difference on the data line GION/GIOT, and the data amplifier 13 determines the logic level of the next read-out data bit DB12. The precharge control signal PIO is changed to the active low level, and the data line pair GION/GIOT is balanced at the precharge level, again.

The precharge circuit 14 periodically changes the data line pair GION/GIOT to the precharge level, and the amplitude of the data line pair GION/GIOT is narrower than that in the read-out sequence using the control signal RASB. As a result, the data read-out using the control signal PEN is faster than the data read-out using the control signal RASB. In fact, the data access time is decreased by 0.1 nanosecond.

Figure 4:
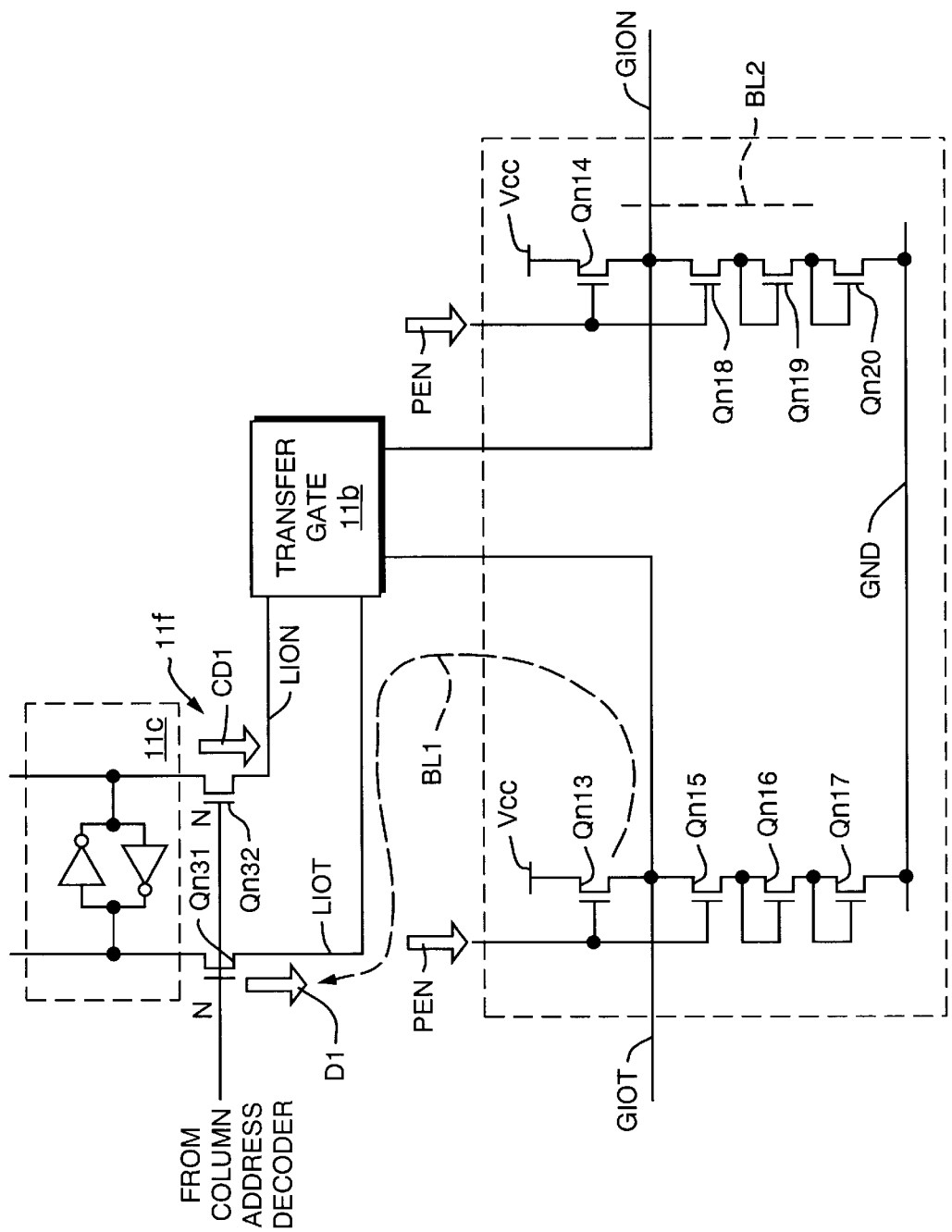
FIG. 4 is a circuit diagram showing current paths offered by a second clamp circuit incorporated in the semiconductor memory device.

FIG. 4 illustrates the circuit behavior of the second clamp circuit 16 in the data access using the control signal PEN. The data signal D1 and the complementary data signal CD1 are assumed to be in the low level and in the high level, respectively. When the bank address signal causes the transfer gate 11b to turn on, electric current flows from the positive power voltage line Vcc through the n-channel enhancement type field effect transistor Qn13, the data line GIOT and the transfer gate 11b into the data line LIOT as indicated by broken line BL1, and the potential level on the data line GIOT is decayed to 0.8 volt.

On the other hand, the data line LION is as high in potential level as the data line GION, and electric current merely flows from the positive power voltage line Vcc through the n-channel enhancement type field effect transistors Qn14/Qn18/Qn19/Qn20 into the ground line GND as indicated by broken line BL2. The second clamp circuit 16 maintains the data line GION at the claim level, i.e., 1.2 volts.

Figure 5:
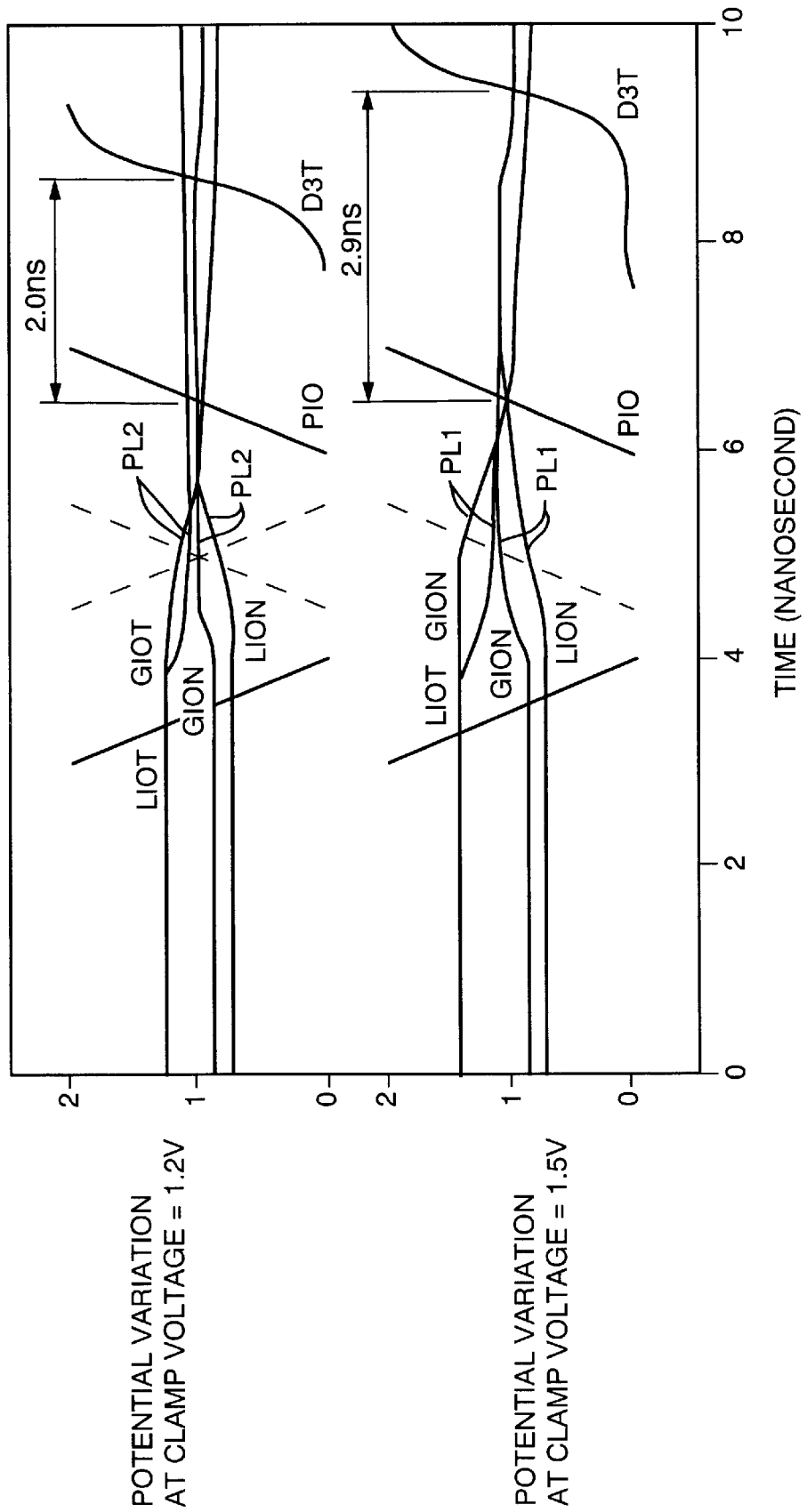
FIG. 5 is a graph showing potential variation on digit lines and data lines at different clamp voltages.

The amplitude on the data line GIOT/GION is decreased from (1.5 volts–0.8 volt) to (1.2 volts–0.8 volts), and the precharge circuit 14 can balance the data lines GIOT and GION at the precharge level within the extremely short time period. The present inventor confirmed the advantages of the low clamp voltage. When the clamp voltage was 1.5 volts, the potential levels on the data lines LION/LIOT and the data lines GION/GIOT were varied as indicated by plots PL1 (see FIG. 5), and the precharge circuit 4 required 2.9 nanoseconds to balance the data lines GION/GIOT until the next data transfer with the control signal D3T. On the other hand, when the clamp voltage was 1.2 volts, the potential levels on the data lines LION/LIOT and the data lines GION/GIOT were varied as indicated by plots PL2, and the precharge circuit 14 required 2.0 nanoseconds to balance the data lines GION/GIOT until the next data transfer with the control signal D3T. Thus, time period required in the precharging is decreased from 2.9 nanoseconds to 2.0 nanoseconds, and the low clamp voltage accelerates the data transfer from the data lines LION/LIOT to the data lines GION/GIOT.

In the above-described embodiment, the memory bank 11/12 serves as a data source, and the data amplifier 13, the read/write data bus RWBSN/RWBST and the input/output circuit 17 as a whole constitute a destination. The first clamp circuit 15 serves as an initial voltage applying mens. When the data bits are written into the memory banks 11/12, the data source and the destination are exchanged.

Although particular embodiments of the present invention have been shown and described, it will be apparent to those skilled in the art that various changes and modifications may be made without departing from the spirit and scope of the present invention.

For example, the power voltage may be 5.0 volts, 3.3 volts or less than 2.0 volts. The clamp voltage may be 55 percent to 65 percent of the power voltage Vcc.

The second clamp circuit 16 may includes only one diode-connected field effect transistor or more than two diode-connected field effect transistors between the data line GION/GIOT and the ground line.

The clamp circuits 15/16 may be implemented by p-channel type field effect transistors. Although the n-channel enhancement type field effect transistors are equal in dimensions to one another in the above-described embodiment, some component field effect transistors may different in size from the other field effect transistors. The large-sized field effect transistors lower the clamp level, and the small-sized field effect transistors raises the clamp level.

The second clamp circuit 16 accelerates the data transfer in any sequential data access mode. Even if the precharge is not carried, the second clamp circuit 16 is desirable for the serial data transfer, because the second clamp circuit rapidly balance the data line with the digit line (see FIG. 4). Therefore, the present invention is never limited to the pipeline data access. Moreover, the present invention is applicable to a data bus incorporated in any kind of semiconductor integrated circuit such as, for example, a microprocessor.

Figure 6:
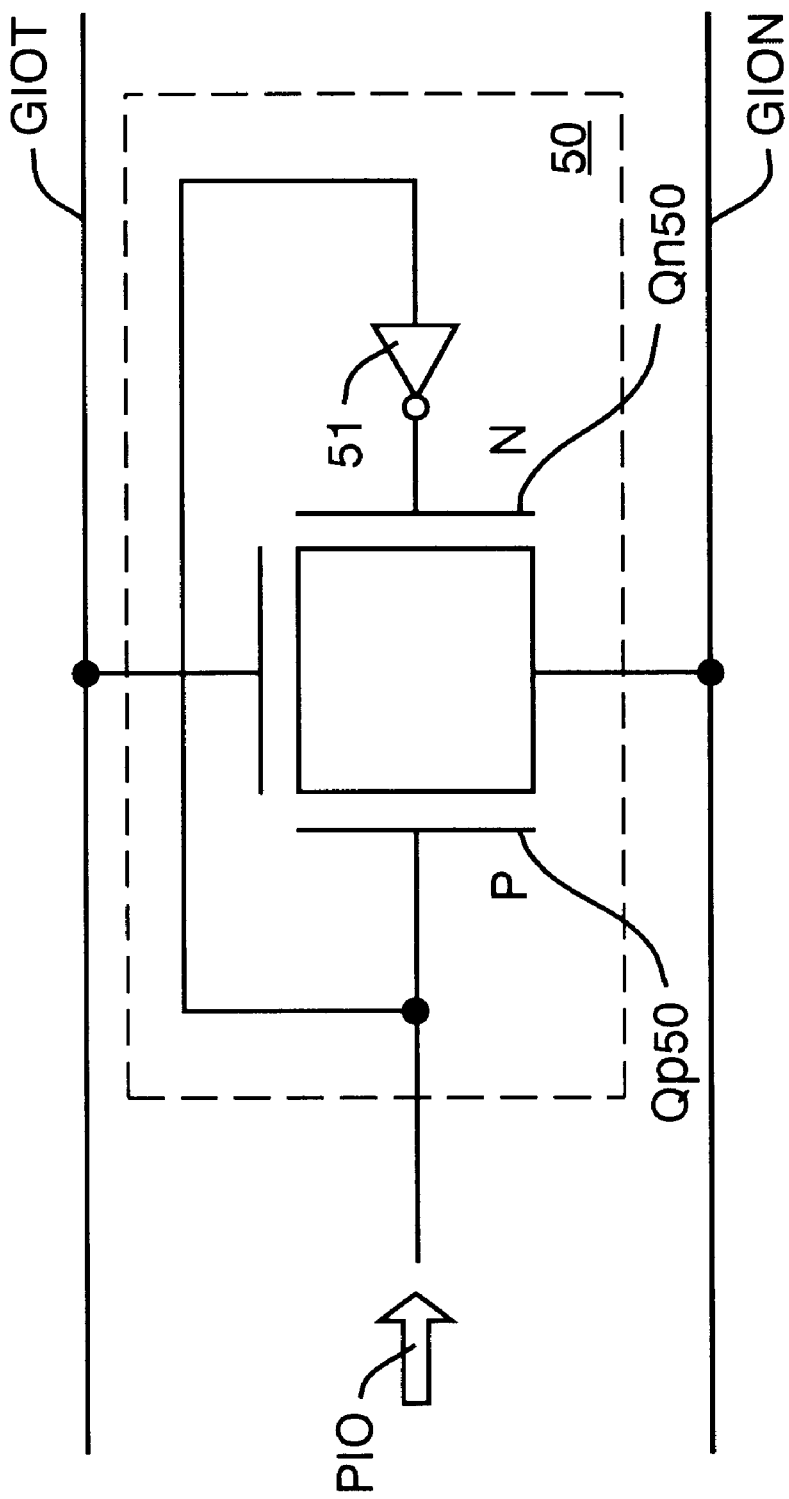
FIG. 6 is a circuit diagram showing the configuration of another precharge circuit incorporated in another semiconductor memory device according to the present invention.

The precharge circuit 14 may have another circuit configuration. FIG. 6 illustrates a modification 50 of the precharge circuit 14. The precharge circuit 50 is implemented by a parallel combination of a p-channel enhancement type field effect transistor Qp50 and an n-channel enhancement type field effect transistor Qn50. The precharge control signal PIO is directly supplied to the gate electrode of the p-channel enhancement type field effect transistor Qp50, and an inverter 51 supplies a complementary signal of the precharge control signal to the gate electrode of the n-channel enhancement type field effect transistor Qn50.

Figure 7:
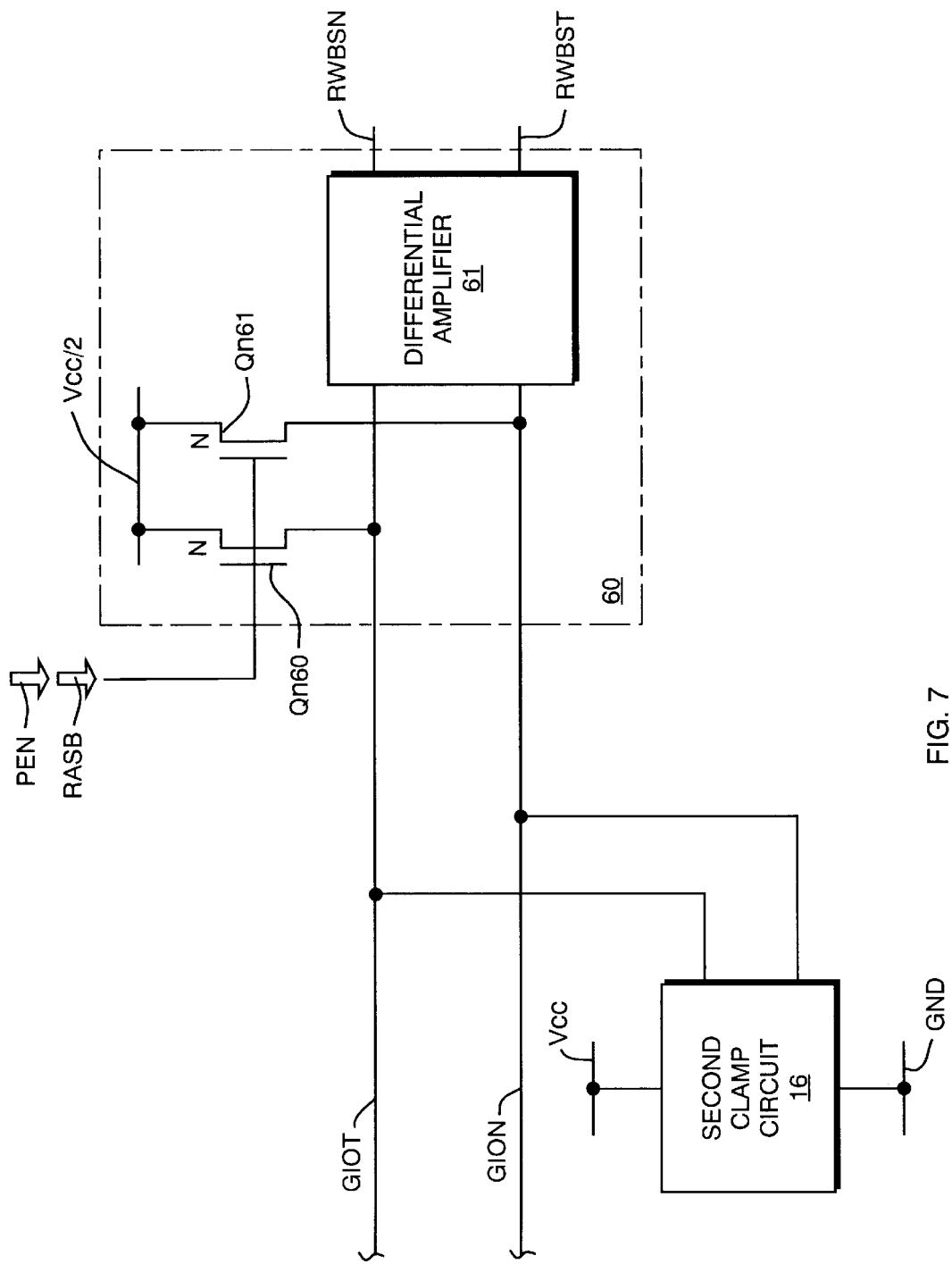
FIG. 7 is a circuit diagram showing the configuration of another data amplifier incorporated in yet another semiconductor memory device according to the present invention.

The data lines GIOT/GION may be charged to the precharge level by a data amplifier 60 shown in FIG. 7. The data amplifier 60 includes a differential amplifier 61 and n-channel enhancement type field effect transistors Qn60/Qn61. The n-channel enhancement type field effect transistors Qn60/Qn61 is responsive to the control signal RASB or PEN so as to charge the data lines GIOT/GION, and the differential amplifier 61 increases a potential difference on the data lines GIOT/GION. The n-channel enhancement type field effect transistors Qn13 to Qn20 are equal in threshold to the n-channel enhancement type field effect transistors such as the n-channel enhancement type field effect transistors Qn60/Qn61 and the n-channel type field effect transistors (not shown) of the differential amplifier 61. The channel doping is once carried out for those field effect transistors, and the fabrication process is simple. In this instance, the first clamp circuit 15 is deleted from the circuit configuration. In this instance, the data amplifier 60 serves as an initial voltage applying means.

What is claimed is:

1. A semiconductor integrated circuit device comprising:
   a destination for receiving a data signal representative of data;
   a data source for producing said data;
   a data bus connected between said data source and said destination, and including a first data line and a second data line paired with said first data line for propagating said data signal in the form of a potential difference from said data source to said destination;
   an initial voltage applying means connected between a source of a first voltage and said first and second data lines; and
   a second clamp circuit connected between a source of a second voltage higher in potential level than said first voltage, said first and second data lines and a source of a third voltage lower in potential level than said first voltage, and clamping one of said first and second data lines to a certain potential level between said first voltage and said second voltage for generating said data signal on said first and second data lines.

2. The semiconductor integrated circuit device as set forth in claim 1, in which said data contains plural data bits serially carried by said data signal.

3. The semiconductor integrated circuit device as set forth in claim 2, further comprising a precharge circuit connected to said first and second data lines and periodically changing said first and second data lines to a precharge level between a data transfer for one of said data bits and the next data transfer for another of said data bits.

4. The semiconductor integrated circuit device as set forth in claim 3, in which said precharge level is approximately equal to said certain potential level.

5. The semiconductor integrated circuit device as set forth in claim 4, in which said precharge circuit has a transistor connected between said first data line and said second data line and responsive to a precharge control signal periodically changed to an active level for balancing said first data line and said second data line at said precharge level.

6. The semiconductor integrated circuit device as set forth in claim 1, in which said second clamp circuit includes
   a first current path connected between said source of said second voltage and said first and second data lines for supplying said second voltage to said first and second data lines, and
   a second current path connected between said first and second data lines and said source of said third voltage for supplying said third voltage to said first and second data lines.

7. The semiconductor integrated circuit device as set forth in claim 6, in which said first current path has a first transistor connected between said source of said second voltage and said first data line and a second transistor connected between said source of said second voltage and second data line, and said second current path has a series combination of a third transistor and a first step-down component connected between said first data line and said source of said third voltage and a series combination of a fourth transistor and a second step-down component connected between said second data line and said source of said third voltage.

8. The semiconductor integrated circuit device as set forth in claim 7, in which said first step-down component and said second step-down component have at least one first diode element and at least one second diode element, respectively.

9. The semiconductor integrated circuit device as set forth in claim 8, in which said at least one first diode element and said at least one second diode element allow electric current to flow from said third transistor and said fourth transistor to said source of said third voltage, respectively.

10. The semiconductor integrated circuit device as set forth in claim 9, in which said at least one diode element and said at least one second diode element are a first field effect transistor having a gate electrode connected to one of source and drain nodes and a second field effect transistor having a gate electrode connected to one of source and drain regions, respectively.

11. The semiconductor integrated circuit device as set forth in claim 7, in which said data contains data bits serially carried by said data signal in a successive data transfer mode, and a control signal representative of said successive data transfer mode causes said first transistor, said second transistor, said third transistor and said fourth transistor to turn on.

12. The semiconductor integrated circuit devices as set forth in claim 11, further comprising a precharge circuit connected to said first and second data lines and periodically changing said first and second data lines to a precharge level between a data transfer for one of said data bits and the next data transfer for another of said data bits.

13. The semiconductor integrated circuit device as set forth in claim 12, in which said precharge level is approximately equal to said certain potential level.

14. The semiconductor integrated circuit device as set forth in claim 13, in which said precharge circuit has a transistor connected between said first data line and said second data line and responsive to a precharge control signal periodically changed to an active level for balancing said first data line and said second data line at said precharge level.

15. The semiconductor integrated circuit device as set forth in claim 1, in which said data source is one of a memory bank and a data input and output means, and said destination is the other of said memory bank and said data input and output means.

16. The semiconductor integrated circuit device as set forth in claim 15, in which said one of said memory bank and said data input and output means supplies said data containing data bits to said first and second data lines in a successive data transfer mode so that said data signal serially carries said data bits to said other of said memory bank and said data input and output means.

17. The semiconductor integrated circuit device as set forth in claim 16, in which said second clamp circuit includes a first current path responsive to a control signal representative of said successive data transfer mode so as to create a first conductive path and a second conductive path connected between said source of said second voltage and said first and second data lines for supplying said second voltage to said first and second data lines, and a second current path responsive to said control signal so as to create a third conductive path and a fourth conductive path connected between said first and second data lines and said source of said third voltage for supplying said third voltage to said first and second data lines.

18. The semiconductor integrated circuit device as set forth in claim 17, in which said first current path has a first transistor connected between said source of said second voltage and said first data line and responsive to said control signal for creating said first conductive path and a second transistor connected between said source of said second voltage and second data line and responsive to said control signal for creating said second conductive path, and said second current path has a series combination of a third transistor and a first step-down component connected between said first data line and said source of said third voltage and a series combination of a fourth transistor and a second step-down component connected between said second data line and said source of said third voltage, said third transistor and said fourth transistor being responsive to said control signal for creating a part of said third conductive path and a part of said fourth conductive path.

19. The semiconductor integrated circuit device as set forth in claim 18, in which said first step-down component and said second step-down component have at least one first diode element and at least one second diode element, respectively.

20. The semiconductor integrated circuit device as set forth in claim 19, in which said at least one diode element and said at least one second diode element are a first field effect transistor having a gate electrode connected to one of source and drain nodes and a second field effect transistor having a gate electrode connected to one of source and drain regions, respectively.

21. The semiconductor integrated circuit device as set forth in claim 18, further comprising a precharge circuit connected to said first and second data lines and periodically changing said first and second data lines to a precharge level between a data transfer for one of said data bits and the next data transfer for another of said data bits.

22. The semiconductor integrated circuit device as set forth in claim 21, in which said precharge level is approximately equal to said certain potential level.

23. The semiconductor integrated circuit device as set forth in claim 21, in which said precharge circuit has a transistor connected between said first data line and said second data line and responsive to a precharge control signal periodically changed to an active level for balancing said first data line and said second data line at said precharge level.

24. The semiconductor integrated circuit device as set forth in claim 15, in which said first voltage, said second voltage and said third voltage are 1 volt, 2 volts and a ground voltage, respectively.

25. The semiconductor integrated circuit device as set forth in claim 24, in which said certain potential level is 55 percent to 65 percent of said second voltage.

26. The semiconductor integrated circuit device as set forth in claim 1, in which said second clamp circuit has first field effect transistors equal in threshold to second field effect transistors forming parts of said initial voltage applying means.

* * * * *